US006445184B1

(12) United States Patent
Tanttu

(10) Patent No.: US 6,445,184 B1
(45) Date of Patent: Sep. 3, 2002

(54) MULTIPLE GRADIENT ECHO TYPE PROJECTION RECONSTRUCTION SEQUENCE FOR MRI ESPECIALLY FOR DIFFUSION WEIGHTED MRI

(75) Inventor: Jukka I. Tanttu, Espoo (FI)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/988,465

(22) Filed: Nov. 20, 2001

(51) Int. Cl.[7] .................................................. G01V 3/00
(52) U.S. Cl. ........................ 324/309; 324/307; 324/312
(58) Field of Search ................................ 324/309, 307, 324/311, 312, 306; 600/410, 419; 128/653.2, 653.3

(56) References Cited

U.S. PATENT DOCUMENTS

| 4,833,407 A | | 5/1989 | Holland et al. ............. 324/309 |
| 5,459,400 A | * | 10/1995 | Moonen ...................... 324/309 |
| 5,833,609 A | | 11/1998 | Dannels ...................... 600/410 |

FOREIGN PATENT DOCUMENTS

EP 604441 * 2/1997

* cited by examiner

*Primary Examiner*—Edward Lefkowitz
*Assistant Examiner*—Brij B. Shrivastav
(74) *Attorney, Agent, or Firm*—Fay, Sharpe, Fagan, Minnich & McKee, LLP

(57) ABSTRACT

In a magnetic resonance imaging apparatus, a subject is disposed in an imaging region (10). A magnet assembly (16, 18) creates a main magnetic field ($B_o$) through the imaging region (10). A sequence of radio frequency pulses and gradient field manipulations excites and manipulates magnetic resonance within dipoles of the subject. The sequence comprises a 90° RF excitation pulse and a 180° refocusing pulse as is known in the art of standard spin echo imaging. The sequence includes gradient pulses that induce at least two gradient recalled RF echoes (98, 100) while suppressing spin echo signals. The sequence also includes diffusion sensitive gradients (76, 82) that sense the movement of water or other molecules during the imaging sequence. The gradient induced echoes (98, 100) are symmetrically disposed about a time (TE). Included in the apparatus is a reconstruction processor (54) that takes real and imaginary portions of the received magnetic resonance signals and converts them into magnitude data of the signals. The magnitude data is used in lieu of phase encoding in reconstruction.

18 Claims, 3 Drawing Sheets

MULTIPLE GRADIENT ECHO TYPE PROJECTION RECONSTRUCTION SEQUENCE FOR MRI ESPECIALLY FOR DIFFUSION WEIGHTED MRI

BACKGROUND OF THE INVENTION

The present invention relates to the diagnostic imaging arts. It finds particular application in conjunction with open MRI systems operating diffusion detection sequences and will be described with particular reference thereto. It will be appreciated, however, that the present invention is useful in conjunction with other systems, such as higher field bore type systems, and is not limited to the aforementioned application.

Typically, in magnetic resonance imaging, a main magnetic field $B_o$ is generated through an imaging region wherein is located a subject. Radio frequency (RF) coils transmit RF pulses into the imaging region exciting and manipulating dipoles within the subject. Gradient coils superimpose gradient magnetic fields on the main magnetic field in order to spatially and spectrally encode the excited dipoles.

Diffusion weighting sequences detect the movement of water in the subject on the cellular level. These sequences typically detect the movement of water on the order of a few microns, or about the distance it takes to cross a cell membrane. Echo planar imaging (EPI) sequences have been used to detect diffusion in a magnetic resonance scan. Although fast in data acquisition, EPI sequences tend to be very motion sensitive and have relatively low signal to noise ratios (SNR).

Rotating k-space diffusion sequences without phase encoding are also used. These sequences are typically more resilient to patient motion, and have higher SNR. However, they take much longer than an EPI sequence, typically on the order of three to four minutes. Another drawback of this type of sequence is that it tends to put heavy loads on the gradient equipment, and is not implementable in all present day MRI scanners. In addition, high, rapidly changing gradient fields can add to patient discomfort.

Fast spin echo (FSE) sequences have also been used to detect diffusion. Multi echo FSE sequences are faster than the rotating k-space sequences, but tend to have other limitations. Stimulated echoes and the primary echo of this type of sequence must have the same time and phase. In a normal FSE sequence, this is generally not a problem, but in a diffusion detection sequence, the phase becomes distorted unpredictably by patient motion and cannot be corrected. Thus, the primary echo and stimulated echoes cannot be summed properly.

Methods to restrict patient motion have been used, but are not desirable. Sedatives can be given to the patient to render the patient immobile, but there is always some degree of risk to the patient. Mechanical restraints are also used to restrict patient motion, but these are often imposing and uncomfortable to the patient. Such discomfort can often cause the patient to fidget and move more than if they were unrestrained.

The present invention provides a new and improved method a nd apparatus that overcomes the above referenced problems and others.

SUMMARY OF THE INVENTION

In accordance with one aspect of the present invention, a method of magnetic resonance is provided. Resonance is excited in selected dipoles of a subject in an imaging region. The resonance is refocused with an inversion pulse, and at least two gradient recalled echos are acquired. Data is collected until enough is present to be reconstructed into an image representation to the subject.

In accordance with another aspect of the present invention, a magnetic resonance apparatus is provided. A main magnetic assembly generates a main magnetic field through a subject in the imaging region. An RF coil assembly transmits RF pulses into the imaging region. A gradient coil assembly superimposes gradient fields on the main magnetic field inducing at least two gradient recalled echos. A receiver receives magnetic resonance signals from the imaging region, and a reconstruction processor reconstructs the received magnetic resonance into an image representation.

One advantage of the present invention resides in faster acquisition times.

Another advantage resides in higher signal to noise ratios in diffusion weighting imaging.

Another advantage resides in more robust data acquisition schemes.

An other advantage resides in reduced RF and gradient loads.

Still further benefits and advantages of the present invention will become apparent to those skilled in the art upon a reading and understanding of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENT

Figure 1:
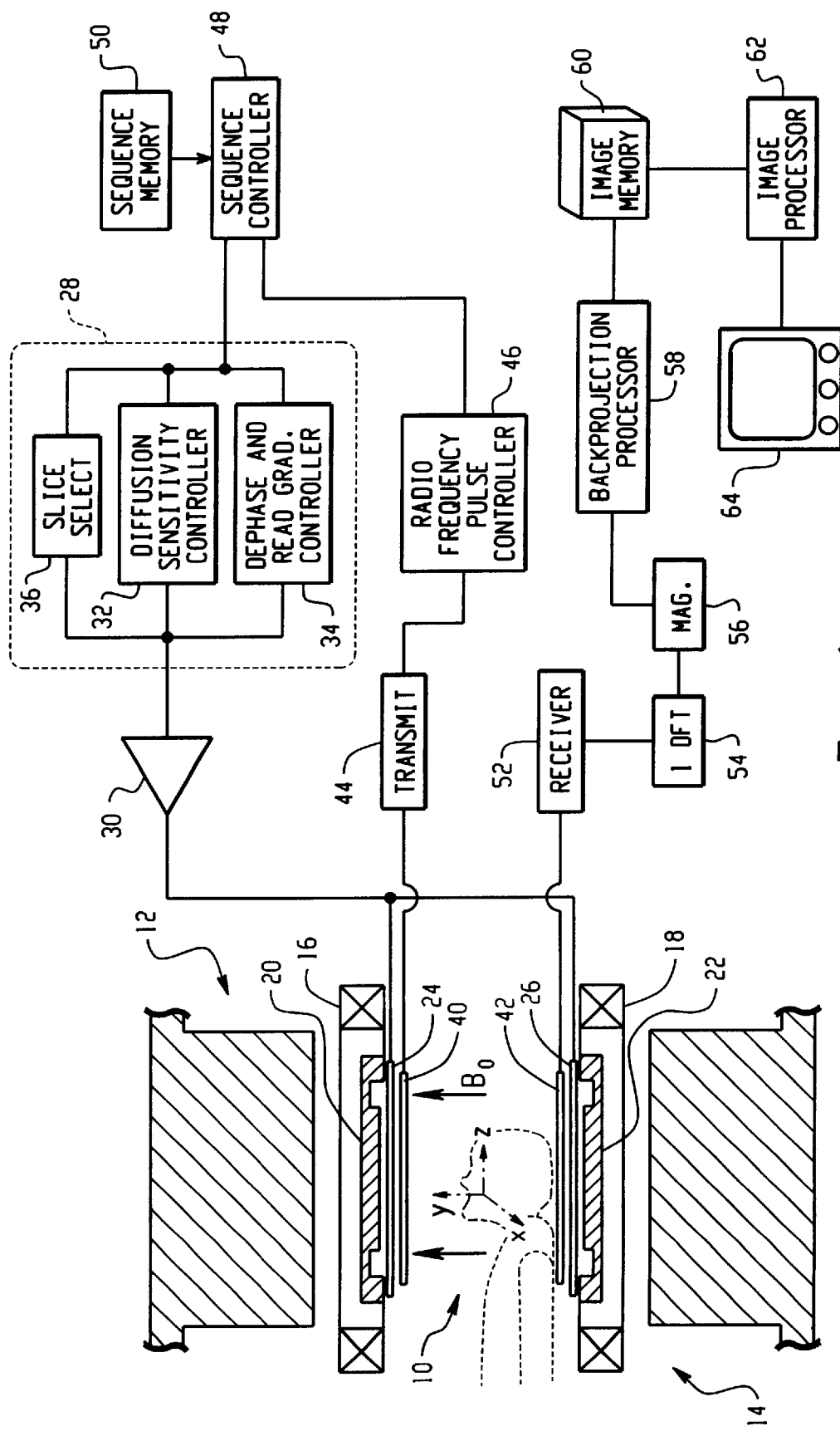
FIG. 1 is a diagrammatic illustration of a magnetic resonance imaging apparatus in accordance with the present invention.

With reference to FIG. 1, a subject is disposed in an imaging region 10 of an magnetic resonance apparatus. Preferably, an open magnetic resonance apparatus is utilized, however, bore type machines have also been contemplated. The subject is disposed in the apparatus between an upper pole assembly 12 and a lower pole assembly 14. Annular magnets 16, 18 preferably resistive magnets, generate a static, main magnetic field $B_o$ through the imaging region 10, between upper and lower pole pieces 20, 22. It is to be understood that superconducting magnets are also contemplated.

For spatially encoding the $B_o$ main field, gradient coils 24, 26 transmit gradient pulses into the imaging region. The pulses are controlled by a gradient field controller 28 and amplified by gradient amplifiers 30 then transmitted to the gradient coils 24,26. In the preferred embodiment, the gradient field controller 28 includes three specific gradient synthesizers which are utilized in constructing the gradient sequence. A diffusion gradient synthesizer 32 synthesizes gradients that sensitize the magnetic resonance apparatus to the diffusion of water or other molecules in the subject. A frequency encoding synthesizer 34 synthesizes gradient pulses that frequency encode resonance in the subject as well as induce gradient recalled echoes in the subject. The third gradient synthesizer is a slice select gradient synthesizer 36. The slice select synthesizer creates gradient pulses that will limit a region of interest within the subject to a slab or a slice.

Upper and lower RF coils 40, 42 transmit RF pulses into the imaging region 10. The pulses are transmitted to the coils 40, 42 by at least one RF transmitter 44, preferably digital. The RF pulses are generated by an RF pulse controller 46. The gradient field controller 28 and the RF pulse controller 46 are both controlled by a sequence controller 48 which retrieves desired sequences from a sequence memory 50.

When the selected pulse sequence induces the desired magnetic resonance manipulations in the subject, the RF coils 40, 42 or other local receive coils detect the resonance signals. The resonance signals are received by at least one receiver 52 and processed by a reconstruction processor 54 which applies a one dimensional Fourier transform or other appropriate reconstruction algorithm to the detected resonance signals. The processed signals are stored in a magnitude memory 56. A backprojection processor 58 backprojects the image magnitudes producing an image representation that is stored in a volumetric image memory 60. An image processor 62 extracts portions of the image representation from the image memory 60 and formats them for display on a human readable display 62 such as a video monitor, LCD display, active matrix monitor, or the like.

Figure 2:
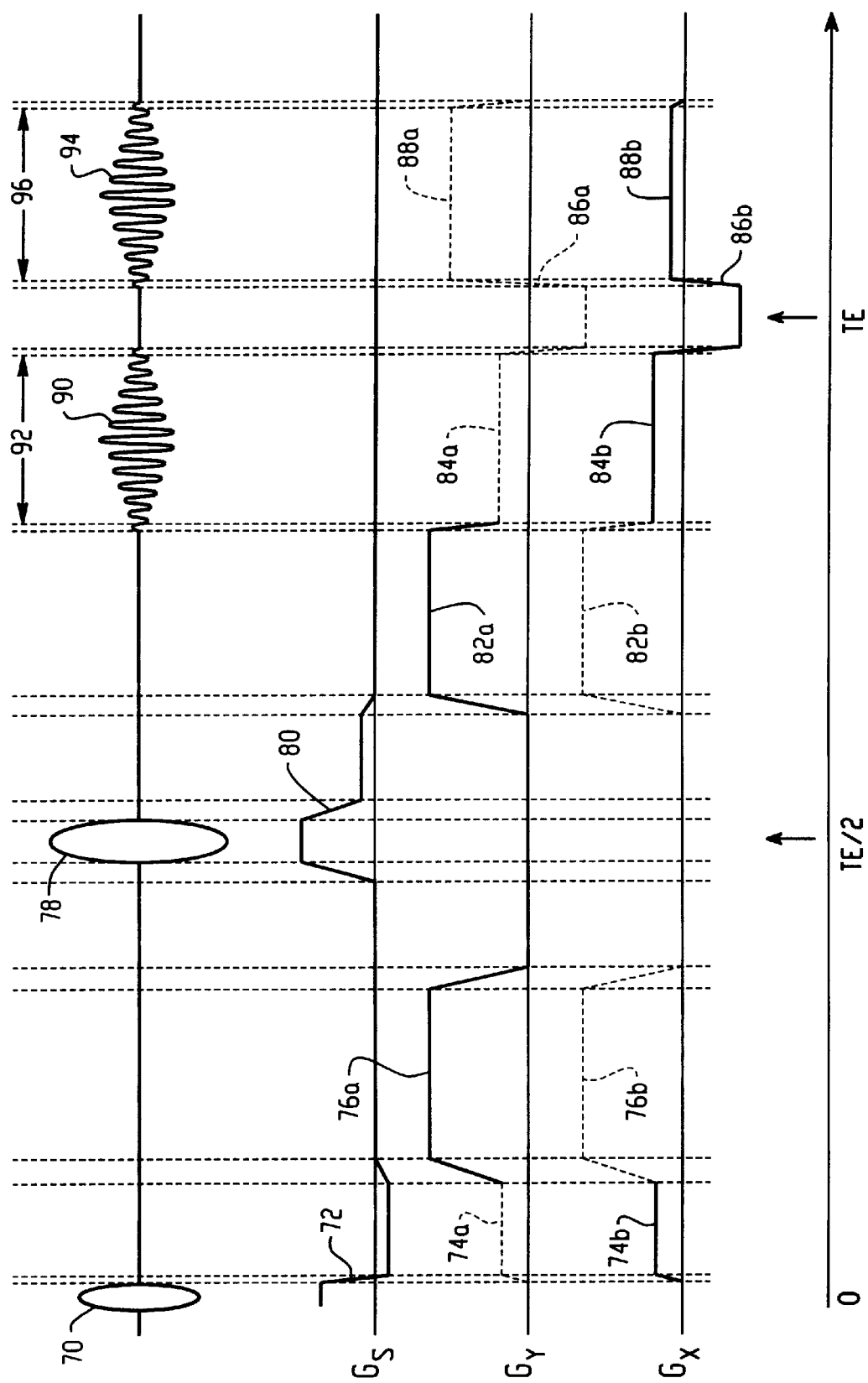
FIG. 2 is a pulse sequence diagram illustrating a diffusion weighting pulse sequence in accordance with the present invention.

With reference to FIG. 2, and with continuing reference to FIG. 1, a preferred pulse sequence is illustrated. Generally, the preferred pulse sequence generates multiple gradient recalled echoes. Magnetic resonance data is read from these echoes in the presence of a plurality of different gradients. Slice select gradients are applied to reduce the imaging volume to a selected slice or slab within the subject. Diffusion gradients and frequency encoding gradients are applied preferably such that their sensitivities are orthogonal to one another. In the preferred embodiment, data is read in the absence of phase encoding gradients.

After the subject has been positioned properly within the imaging region 10, the sequence is initiated. A 90° RF excitation pulse 70 is applied in the presence of a slab select gradient 72. The excitation pulse 70 preferably tips magnetic dipoles selected by the slab select gradient 72 into the transverse plane, that is, approximately 90°. 90° of tip yields a relatively strong signal, in comparison to lesser degrees of initial tip. It is to be understood that other tip angles are possible, with 90° being preferred as it yields a higher SNR with a possibility for the most gradient recalled echoes.

Immediately following the excitation pulse 70 a dephase gradient 74 is applied to the imaging region. The dephase gradient is composed of a y-component 74a and an x-component 74b. The x and y directions refer to the orthogonal directions in the excited slab, and they also define the directions $k_x$ and $k_y$ in k-space. The purpose of the dephase gradient is to form an echo in the first read gradient event. Alternatively, it may be applied after the refocusing pulse with opposite sign. The two portions of the dephase gradient 74 combine to define a directional vector of sensitivity in k-space.

Following the dephase gradient 74, a first portion of a diffusion sensitivity gradient 76 is applied. Similar to the dephase gradient 74, the first portion of the diffusion gradient is divided into a y-component 76a and an x-component 76b. Subsequent to the first portion of the diffusion gradient 76 is a 180° refocusing RF pulse 78. Concurrent with the refocusing pulse 78, a second slice select gradient 80 is applied. The first and second slice select gradients 72, 80 select the same region within the subject such that the excitation pulse 70 and the refocusing pulse 78 affect the same region. Following the second slice select gradient is a second portion of the diffusion sensitivity gradient 82. Similar to the first portion 76 the second portion 82 is divided into a y-component 82a and an x-component 82b. Collectively, the diffusion sensitivity gradient 76, 82 detects the diffusion of selected molecules, preferably water, during times when it is active. The first part 76 and the second part 82 of the diffusion sensitivity gradient are preferably disposed symmetrically in time about the 180° refocusing RF pulse 78. Preferably, the gradient lobes 76 and 82 should have the same area.

Following the second part of the diffusion gradient 82 a first frequency encode gradient 84, commonly known as a read gradient, is applied. Similar to the previous gradients, the first read gradient 84 is composed of a y-component 84a and an x-component 84b. Preferably, the two components define a directional vector that is approximately perpendicular to the directional sensitivity of the diffusion gradient 76, 82 and has the same direction as the dephasing gradient 74. In the preferred embodiment, the area underneath lobes of the first read gradient 84 is approximately twice the size of the area underneath the dephase gradient 74.

In order to induce gradient recalled echoes, a reversal gradient 86 is applied to the imaging region. The reversal gradient, similar to the other gradients has a y-component 86a and an x-component 86b. The reversal gradient effectively resets the data readout in k-space, and defines where one data line stops and the next one begins. Subsequently, another read gradient 88 is applied to form a second data line in k-space. The second read gradient comprises a y-component 88a and an x-component 88b. As illustrated, the second read gradient 88 is slightly different than the first read gradient 86. Preferably, the read direction of the second read gradient 88 is shifted less than one degree from the read direction of the first read gradient 84.

Figure 3:
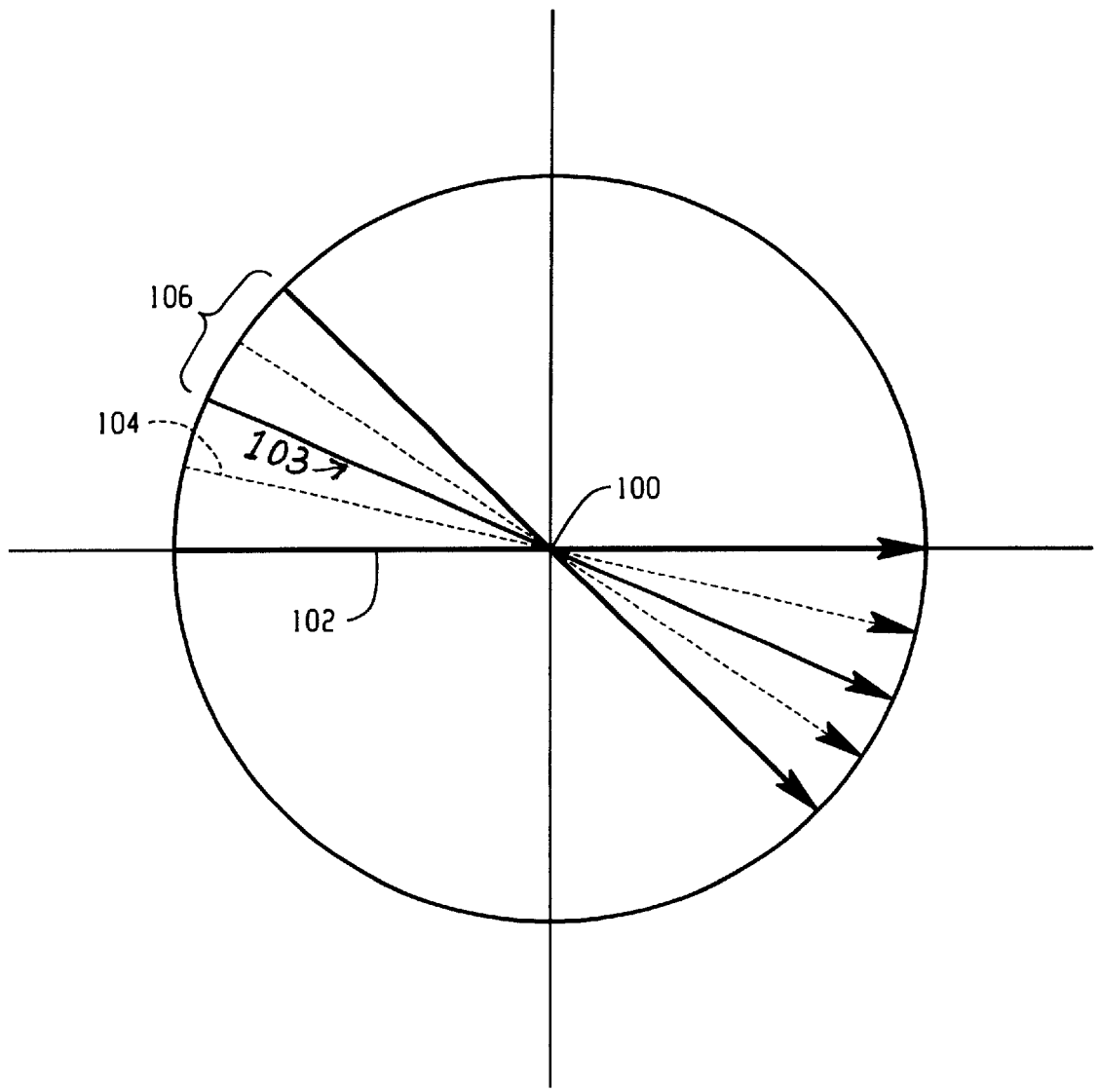
FIG. 3 is a preferred trajectory through k-space, generated by multiple iterations of the pulse sequence of FIG. 2.

In the preferred embodiment, and as illustrated in FIG. 3, data lines are stepped in a rotational fashion about a center of k-space 100. The first read gradient 84 generates a data line 102 in k-space. The second read gradient 88 generates a second data line 103 with a slightly different read direction than the first data line 102. The preferred sequence makes 256 steps around 180° making the angle 106 between each data line approximately 0.70°. Of course, more or fewer steps can be taken, it is preferred, however, that the angle between data lines be no greater than 10° as the sequence will become sensitive to motion of the subject, as discussed in the background. Additional data lines are generated with additional cycles of the described two echo embodiment.

Alternately, additional data lines can be read by utilizing additional reversal gradients. In a three echo embodiment, the second reversal gradient is approximately the same amplitude of the reversal gradient 86, with a small change in the direction of the third read gradient, producing data line 104. As a practical limit, about four gradient recalled echoes may be induced from one RF excitation pulse. After four echoes, the phase errors accumulated in the gradient recalled echoes may become too large.

In the illustrated two echo embodiment, RF echoes 90 and 94 occur in time windows 92, and 96 respectively and are disposed symmetrically about a time TE. In additional echo embodiments, the group of echoes is centered on the time TE, for example, in a three echo embodiment, the second echo is centered on the time TE. The 180° refocusing pulse 78 occurs at a time TE/2, as implied, the time TE/2 occurs at half the value of time TE.

As was stated earlier, the RF echoes are received in the absence of phase encoding. Projection reconstruction methods are used to form the image. Because the gradient echo signal typically contains phase errors, reconstruction methods using magnitude data are preferred. In the preferred embodiment, the receiver 52 receives a real part and an imaginary part of the magnetic resonance signals. The reconstruction processor 54, as part of the reconstruction, adds the squares of the real and imaginary parts and takes the square root. Simplified, if the real part is x and the imaginary part is y the reconstruction processor performs the operation $\sqrt{x^2+y^2}$ to obtain the magnitude data of the received resonance signals.

In an alternate embodiment, no reversal gradients are used. Instead, subsequent gradients are substantially opposite each other. That is, if the first gradient lobe is positive, the second is negative, and so forth. In this embodiment, the frequency encoding gradients run subsequently with no interruption, or possibly with a small gradient pulse in-between to adjust the starting point of the data line. In this embodiment, the data lines are read in opposite directions, and the arrowheads in FIG. 3 would likewise alternate.

In an alternate embodiment, the diffusion gradient pulses 76, 82 are both applied before the refocusing pulse 80. In this embodiment, the pulses have opposite signs.

In an alternate embodiment, the diffusion gradient pulses 76, 82 contain a component in the direction of the slice select gradient. Despite this modification, the requirement that the diffusion gradient be orthogonal to the read gradient can still be fulfilled.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A method of magnetic resonance diffusion imaging comprising:

a) exciting resonance in selected dipoles of a subject in an imaging region;
   b) applying a first diffusion gradient to the imaging region;
   c) refocusing the resonance with an inversion pulse;
   d) after refocusing the resonance, applying a second diffusion gradient to the imaging region;
   e) acquiring at least two gradient recalled echoes prior to a signal decay of the excited dipoles, generating at least two data lines, the at least two echos being acquired with read gradients of different directions;
   f) repeating steps (a)–(e) with angularly shifted read directions until enough data lines are generated to reconstruct an image representation of the subject in the imaging region.

2. The method as set forth in claim 1, wherein the diffusion gradients include x and y components in a two-dimensional k-space.

3. The method as set forth in claim 1, wherein the diffusion gradients include x, y, and z components in a three-dimensional k-space.

4. The method as set forth in claim 1, further including:
   applying frequency encoding events, one corresponding to each of the at least two gradient recalled echoes, concurrently with the at least two gradient recalled echoes.

5. The method as set forth in claim 4, wherein the diffusion gradients include directional sensitivities substantially orthogonal to sensitivities of the frequency encoding events.

6. The method as set forth in claim 5, wherein the sensitivity of the frequency encoding events are within 10° of orthogonal to the sensitivities of the diffusion gradients.

7. The method as set forth in claim 1, further including:
   applying a dephase gradient to the imaging region prior to the application of the read gradient, the dephase gradient having one of:
   the same sign as the read gradient if applied before the inversion pulse; and,
   the opposite sign of the read gradient if applied after the inversion pulse.

8. The method as set forth in claim 7, wherein an area of the dephase gradient is substantially half of an area of a first frequency encoding event.

9. The method as set forth in claim 1, further including:
   applying at least one reversal gradient to the imaging region to induce at least one subsequent gradient recalled echo.

10. The method as set forth in claim 1, wherein the at least two gradient recalled echoes are disposed symmetrically in time about a time TE.

11. The method as set forth in claim 10, wherein the inversion pulse is centered on a time TE/2 which occurs at half a time value of TE.

12. The method as set forth in claim 1, further including:
    applying a transform operation to the gradient recalled echoes to generate magnitude data lines;
    backprojecting the magnitude data lines into an image representation.

13. A magnetic resonance apparatus comprising:
    a main magnetic assembly for generating a main magnetic field through a subject in an imaging region;
    an RF coil assembly for transmitting RF pulses into the imaging region, the RF pulses including at least an excitation pulse and a inversion pulse;
    a gradient coil assembly for applying: (1) a first diffusion encoding gradient magnetic field lobe preceding the inversion pulse, (2) a second diffusion encoding gradient magnetic field lobe following the inversion pulse, and (3) read gradients to induce at least two diffusion sensitive gradient recalled RF echoes in different directions;
    a receiver for receiving magnetic resonance signals from the imaging region;
    a reconstruction processor for reconstructing the received magnetic resonance signals into an image representation.

14. The magnetic resonance apparatus as set forth in claim 13, wherein the reconstruction processor applies a transform to received resonance signals to determine a magnitude of the received magnetic resonance signals.

15. The magnetic resonance apparatus as set forth in claim 13, wherein the gradient field lobes are symmetrically disposed about an echo time TE, the echo time TE being twice that of a time TE/2 at which a refocusing radio frequency pulse is applied.

16. The magnetic resonance apparatus as set forth in claim 15, wherein the gradient coil assembly applies the diffusion gradient lobes prior to the frequency encode gradient lobe and after an RF excitation pulse.

17. The magnetic resonance apparatus as set forth in claim 16, wherein a direction of sensitivity of the frequency encoding gradient lobes is substantially orthogonal to a direction of sensitivity of the diffusion detection gradient lobes.

18. The magnetic resonance apparatus as set forth in claim 16, wherein the gradient coil assembly applies the diffusion detection gradient lobes symmetrically about the time TE/2.

* * * * *